United States Patent
Kim et al.

(10) Patent No.: US 7,408,254 B1
(45) Date of Patent: Aug. 5, 2008

(54) STACK LAND GRID ARRAY PACKAGE AND METHOD FOR MANUFACTURING THE SAME

(76) Inventors: Bong Chan Kim, #118-207, Su Seo APT., Irwon-dong, Gangnam-gu, Seoul (KR); Yoon Joo Kim, #207-804, Cheongam APT., Sanggye 3-dong, Nowon-gu, Seoul (KR); Youn Sang Kim, #405-1032, Jeondeunmaeul Woosung APT., Jeongja-dong, Bundan-gu, Seongnam-si, Gyeonggi-do (KR)

( * ) Notice: Subject to any disclaimer, the term of this patent is extended or adjusted under 35 U.S.C. 154(b) by 74 days.

(21) Appl. No.: 11/212,979

(22) Filed: Aug. 26, 2005

(51) Int. Cl.
*H01L 23/02* (2006.01)

(52) U.S. Cl. ........... 257/686; 257/779

(58) Field of Classification Search ........... 257/777, 257/787, 779, 686
See application file for complete search history.

(56) References Cited

U.S. PATENT DOCUMENTS

| | | | | |
|---|---|---|---|---|
| 5,239,198 A | * | 8/1993 | Lin et al. | 257/693 |
| 5,838,070 A | * | 11/1998 | Naruse et al. | 257/779 |
| 6,906,414 B2 | * | 6/2005 | Zhao et al. | 257/707 |
| 2002/0086459 A1 | * | 7/2002 | Nakajima | 438/106 |
| 2004/0113275 A1 | * | 6/2004 | Karnezos | 257/758 |

* cited by examiner

*Primary Examiner*—David Zarneke
*Assistant Examiner*—Jenny L Wagner
(74) *Attorney, Agent, or Firm*—Weiss & Moy, P.C.

(57) ABSTRACT

A semiconductor device has a substrate having first, second, and third surfaces. An electrically conductive pattern is formed on the first surface. A semiconductor die has a bond pad formed on a first surface thereof. A second surface of the semiconductor die is coupled to the first surface of the substrate. A first connection member electrically couples the bond pad and the electrically conductive pattern. A first land has a first, second, and third surfaces. The second surface of the first land is coupled to the first electrically conductive pattern. A first encapsulant encapsulates the first semiconductor die, the first connection member, and the first land such that the first surface of the first land is exposed.

20 Claims, 6 Drawing Sheets

STACK LAND GRID ARRAY PACKAGE AND METHOD FOR MANUFACTURING THE SAME

BACKGROUND OF THE INVENTION

1. Field of the Invention

The present invention relates to a semiconductor package and, more specifically, a stack land grid array package and a method for manufacturing the same.

2. Description of the Related Art

In general, land grid array packages include a substrate, a semiconductor die attached to the substrate, a connection member for connecting the substrate and the semiconductor die, an encapsulant for encapsulating the semiconductor die and the substrate, and lands formed on a surface of the substrate to allow the package to be mounted on an external device. The land grid array packages have reduced manufacturing cost, because the lands (not solder balls) are directly mounted on an external device and a process for thermally bonding solder balls can be omitted from the manufacturing processes.

Recently, companies have begun to stack a number of semiconductor dies inside a single semiconductor package or stack a number of semiconductor packages on one another so that electronic products incorporating them have a larger capacity and more functions. However, above-mentioned conventional land grid array packages have a problem in that it is difficult to stack a number of semiconductor dies on a single substrate. This is because a semiconductor die is attached to a surface of the substrate and a number of lands are formed on the other surface thereof. The fact that the semiconductor dies can only be attached to one of two surfaces of the substrate makes stacking multiple dies difficult. It may be possible to stack a semiconductor die on another. However, this requires that the adhesive interposed between the semiconductor dies have a thickness large enough to preventing conductive wires connected to the lower semiconductor die from sweeping or short-circuiting. In addition, the adhesive must have a low elastic constant and excellent degree of flatness so that conductive wires can be easily connected to the upper semiconductor die. As such, very expensive adhesive is necessary for stacking between the semiconductor dies.

Furthermore, conventional land grid array packages having lands formed only on a surface of the substrate cannot be stacked in large numbers along the vertical direction. In order to stack a number of land grid array packages, a number of lands must be positioned on both surfaces of the substrate while being exposed to the exterior. However, the substrate of conventional land grid array packages has an encapsulant completely encapsulating a surface thereof and a number of lands formed on the other surface thereof. Such a construction makes it impossible to stack the packages in large numbers.

Therefore, a need existed to provide a stackable land grid array package and a method for manufacturing the same.

BRIEF SUMMARY OF THE INVENTION

A semiconductor device and method of manufacturing the same has a substrate. The substrate has a first surface, a second surface approximately parallel to the first surface, a third surface positioned along the periphery of the first and second surfaces and approximately perpendicular to the first and second surfaces, and at least one first electrically conductive pattern formed on the first surface of the substrate. A first semiconductor die having a first surface, a second surface approximately parallel to the first surface, and at least one first bond pad formed on the first surface, is coupled to the first surface of the substrate. A first connection member couples the first bond pad of the first semiconductor die and the first electrically conductive pattern of the substrate. A first land is formed having a first surface, a second surface approximately parallel to the first surface, and a third surface positioned along the outer periphery of the first and second surfaces while being approximately perpendicular to the first and second surfaces. The second surface of the first land being coupled to the first electrically conductive pattern. A first encapsulant is sued for encapsulating the first semiconductor die, the first connection member, and the first land such that the first surface of the first land is exposed.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1A:
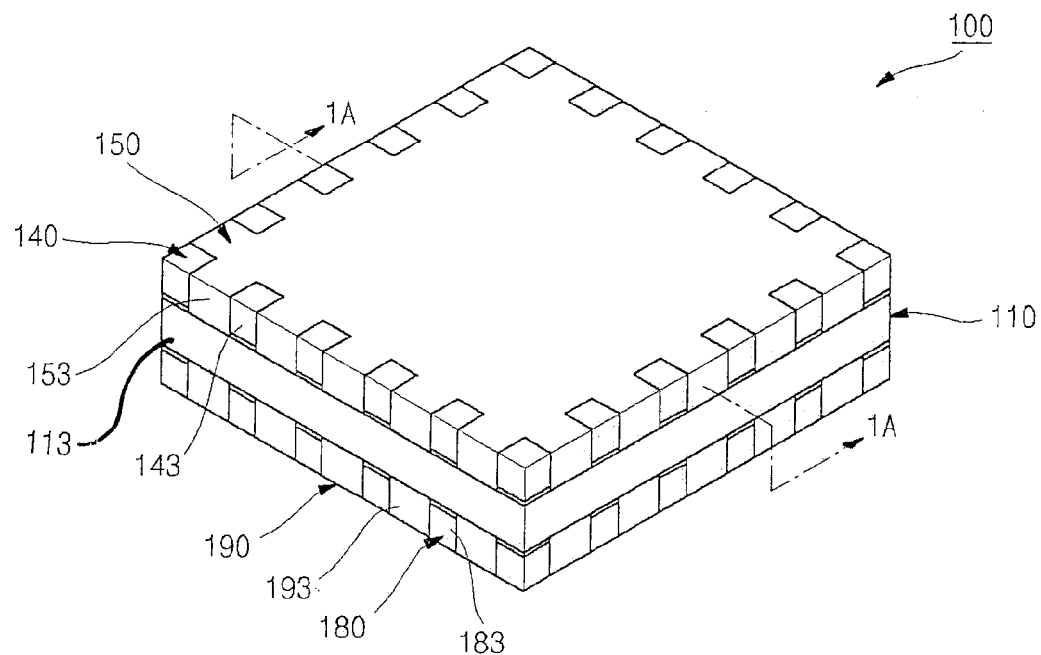
FIG. 1A is a perspective view showing a stack land grid array package according to an embodiment of the present invention.
Figure 1B:
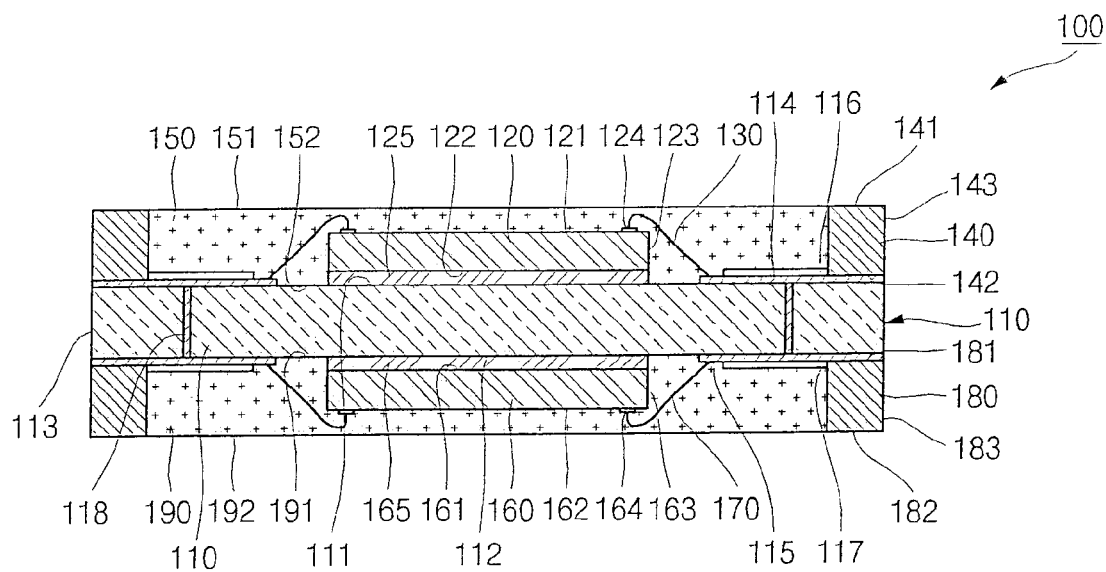
FIG. 1B is a sectional view taken along line 1A-1A of FIG. 1A.

Referring to FIGS. 1A and 1B, a stack land grid array package 100 is shown. The stack land grid array package 100 includes a substrate 110; a first semiconductor die 120 attached approximately to the upper surface of the substrate 110; a first connection member 130 for electrically connecting the substrate 110 and the first semiconductor die 120; a first land 140 formed approximately on the upper surface of the substrate 110; a first encapsulant 150 for encapsulating the first semiconductor die 120, the first connection member 130, and the first land 140; a second semiconductor die 160 attached approximately to the lower surface of the substrate 110; a second connection member 170 for electrically connecting the substrate 110 and the second semiconductor die 160; a second land 180 formed approximately on the lower surface of the substrate 110; and a second encapsulant 190 for encapsulating the second semiconductor die 160, the second connection member 170, and the second land 180. The substrate 110 includes an insulation layer 110' having predetermined area and thickness. The insulation layer 110' has an approximately planar first surface 111, an approximately planar second surface 112 opposing the first surface 111, and a third surface 113 positioned along the periphery of the first and second surfaces 111 and 112 while being approximately perpendicular to them. The substrate 110 has at least one first electrically conductive pattern 114 formed on the first surface 111 of the insulation layer 110' and at least one second electrically conductive pattern 115 formed on the second surface 112 thereof. The substrate 110 may have a conductive via 118 formed on the insulation layer 110' to electrically connect the first and second electrically conductive patterns 114 and 115. The entire surface of the insulation layer 110' is coated with thin protective layers 116 and 117, except for a region to which a connection member or land is to be connected later, to protect the first and second electrically conductive patterns 114 and 115 from external environments. The protective layers 116 and 117 may be omitted if necessary. The substrate 110 may be any one chosen from a conventional rigid PCB, a flexible PCB, and an equivalent thereof, but the kind of the substrate 110 is not limited herein. The substrate 110 has electrically conductive patterns 114 and 115 on two layers as shown in FIG. 1B. However, the substrate 110 may have electrically conductive pattern of multi layers, and the number of the layers is not limited in the present invention.

The first semiconductor die 120 is attached approximately to the center of the insulation layer 110' of the substrate 110, particularly to the center of the first surface 111 of the insulation layer 110', with an adhesive 125. The first semiconductor die 120 has an approximately planar first surface 121, an approximately planar second surface 122 opposing the first surface 121, and a third surface 123 positioned along the periphery of the first and second surfaces 121 and 122 while being approximately perpendicular to them. The first semiconductor die 120 has at least one first bond pad 124 formed on the first surface 121. The second surface 122 of the first semiconductor die 120 is attached to the first surface 111 of the insulation layer 110' with the adhesive 125.

The first connection member 130 electrically connects the first electrically conductive pattern 114 of the substrate 110 and the first bond pad 124 of the first semiconductor die 120 to each other. The first connection member 130 may be a conventional conductive wire such as a gold wire, an aluminum wire, and a copper wire, but the material is not limited in the present invention.

The first land 140 has an approximately planar first surface 141, an approximately planar second surface 142 opposing the first surface 141, and a third surface 143 positioned along the outer periphery of the first and second surfaces 141 and 142 while being approximately perpendicular to them. The second surface 142 of the first land 140 is connected to the first electrically conductive pattern 114. The first land 140 may be made of one of the following materials: conventional copper, aluminum, UBM (Under Bumped Metal), alloy, and an equivalent thereof, but the material is not limited herein.

The first encapsulant 150 encapsulates the first semiconductor die 120, the first connection member 130, and a portion of the first land 140 and protects them from external environments. More particularly, the first encapsulant 150 has an approximately planar first surface 151, a second surface 152 bonded approximately to the substrate 110 while opposing the first surface 151, and a third surface 153 positioned along the periphery of the first and second surfaces 151 and 152 while being approximately perpendicular to them.

The first surface 151 of the first encapsulant 150 is approximately flush with the first surface 141 of the first land 140, so that the first surface 141 of the first land 140 is exposed to the exterior. In this manner, the first surface 141 of the first land 140 can be directly mounted on an external device. The third surface 143 of the first land 140 may also be exposed to the exterior. Specifically, the third surface 143 of the first land 140 is approximately flush with the third surface 153 of the first encapsulant 150, so that the third surface 143 of the first land 140 is exposed to the exterior of the third surface 153 of the first encapsulant 150 (See FIG. 1A). In this manner, the third surface 143 of the first land 140 can be directly mounted on an external device. Furthermore, the third surface 143 of the first land 140 may be flush with the third surface 113 of the insulation layer 110'. In particular, the first land 140 may be formed approximately in the peripheral region of the substrate 110. The third surface 113 of the insulation layer 110', the third surface 143 of the first land 140, and the third surface 153 of the first encapsulant 150 may be flush with one another, so that the third surfaces 143 and 113 and the insulation layer 110' can be exposed to the exterior.

The first encapsulant 150 may be made of any one chosen from a conventional molding compound, a liquid epoxy resin, and an equivalent thereof, but the material is not limited herein.

The second semiconductor die 160 is attached approximately to the center of the insulation layer 110' of the substrate 110, particularly to the center of the second surface 112 of the insulation layer 110', with an adhesive 165. The second semiconductor die 160 has an approximately planar first surface 161, an approximately planar second surface 162 opposing the first surface 161, and a third surface 163 positioned along the periphery of the first and second surfaces 161 and 162 while being approximately perpendicular to them. The second semiconductor die 160 has at least one second bond pad 164 formed on the second surface 162. The first surface 161 of the second semiconductor die 160 is attached to the second surface 112 of the insulation layer 110' with the adhesive 165.

The second connection member 170 electrically connects the second electrically conductive pattern 115 of the substrate 110 and the second bond pad 164 of the second semiconductor die 160 to each other. The second connection member 170 may be a conventional conductive wire such as a gold wire, an aluminum wire, and a copper wire, but the material is not limited in the present invention.

The second land 180 has an approximately planar first surface 181, an approximately planar second surface 182 opposing the first surface 181, and a third surface 183 positioned along the outer periphery of the first and second surfaces 181 and 182 while being approximately perpendicular to them. The first surface 181 of the second land 180 is connected to the second electrically conductive pattern 115. The second land 180 may be made from any of the following material: conventional copper, aluminum, UBM (Under Bumped Metal), alloy, and an equivalent thereof, but the material is not limited herein.

The second encapsulant 190 encapsulates the second semiconductor die 160, the second connection member 170, and a portion of the second land 180 and protects them from external environments. More particularly, the second encapsulant 190 has a first surface 191 bonded to the substrate 110, an approximately planar second surface 192 opposing the first surface 191, and a third surface 193 positioned along the periphery of the first and second surfaces 191 and 192 while being approximately perpendicular to them.

The second surface 192 of the second encapsulant 190 is approximately flush with the second surface 182 of the second land 180, so that the second surface 182 of the second land 182 is exposed to the exterior of the second surface 192 of the second encapsulant 190. In this manner, the second surface 182 of the second land 180 can be directly mounted on an external device. The third surface 183 of the second land 180 may also be exposed to the exterior of the second encapsulant 190. Specifically, the third surface 183 of the second land 180 is approximately flush with the third surface 193 of the second encapsulant 190, so that the third surface 183 of the second land 180 is exposed to the exterior of the third surface 193 of the second encapsulant 190. In this manner, the third surface 183 of the second land 180 can be directly mounted on an external device. Furthermore, the third surface 183 of the second land 180 may be flush with the third surface 113 of the insulation layer 110'. In particular, the second land 180 may be formed approximately in the peripheral region of the substrate 110. The third surface 113 of the insulation layer 110', the third surface 183 of the second land 180, and the third surface 193 of the second encapsulant 190 may be flush with one another, so that the third surfaces 183 and 113 and the insulation layer 110' can be exposed to the exterior.

The second encapsulant 190 may be made of any one chosen from a conventional molding compound, a liquid epoxy resin, and an equivalent thereof, but the material is not limited herein.

Meanwhile, the third surface 113 of the insulation layer 110', the third surface 143 of the first land 140, the third surface 153 of the first encapsulant 150, the third surface 183 of the second land 180, and the third surface 193 of the second encapsulant 190 are flush with one another.

The stack land package 100 according to the present invention, constructed as above, can have two semiconductor dies 120 and 160 positioned on a single substrate 110. In particular, semiconductor dies 120 and 160 can be positioned on the upper and lower surfaces of the substrate 110, respectively. When used as a stack land package for memory, it can double the capacity and, when used as a stack land package for operation, it can double the operation capability. In addition, the package 100 has lands 140 and 180 formed on the upper and lower surfaces thereof, respectively, so that an external device can be connected to both the upper and lower surfaces thereof. It is then possible to stack external devices about the stack land grid array package 100. Unlike ball grid array packages, the lands 140 and 180 of the stack land grid array package 100 according to the present invention are exposed via the upper, lower, and lateral surfaces of the encapsulants 150 and 190 for an easy test process. Particularly, the probe of a test device can easily access the stack land grid array package.

Figure 2:
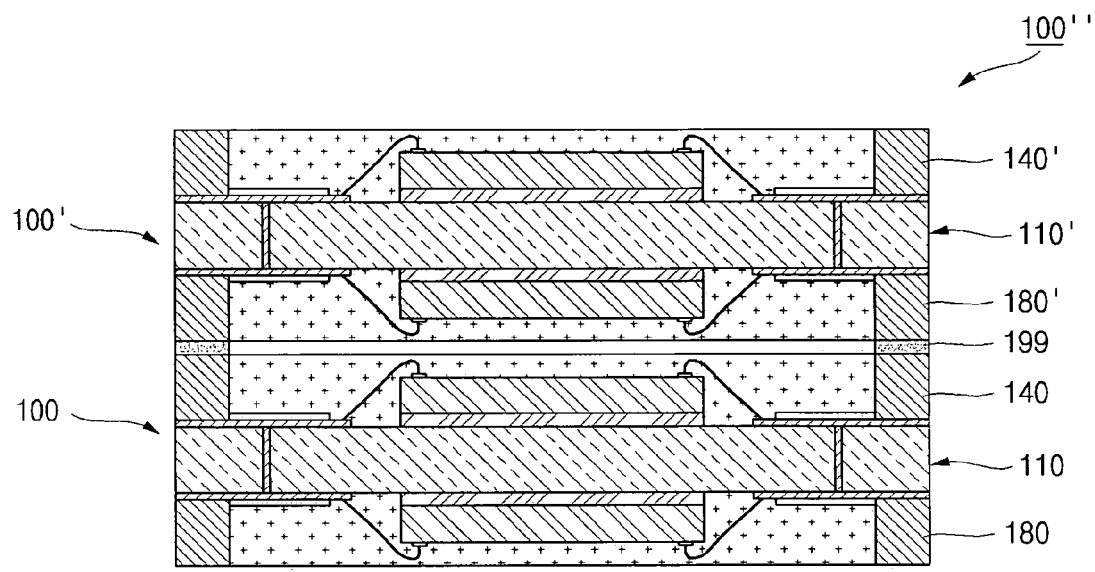
FIG. 2 is a sectional view showing a stack land grid array package according to another embodiment of the present invention.

Referring to FIG. 2, a stack land grid array package 100" according to another embodiment of the present invention is illustrated. As shown, the stack land grid array package 100" can stack not only semiconductor dies, but also other packages thereon. Particularly, a second land 180' of a package 100' is connected to a first land 140 of another package 100 via a conductor 199, as shown in the drawing, to stack the packages on each other. This structure has better memory capacity and functions than a structure wherein a single semiconductor die is positioned on each substrate. It is obvious to those skilled in the art that, although two packages are shown to be stacked on each other in the drawing, this is an example only and more packages can be stacked.

Figure 3:
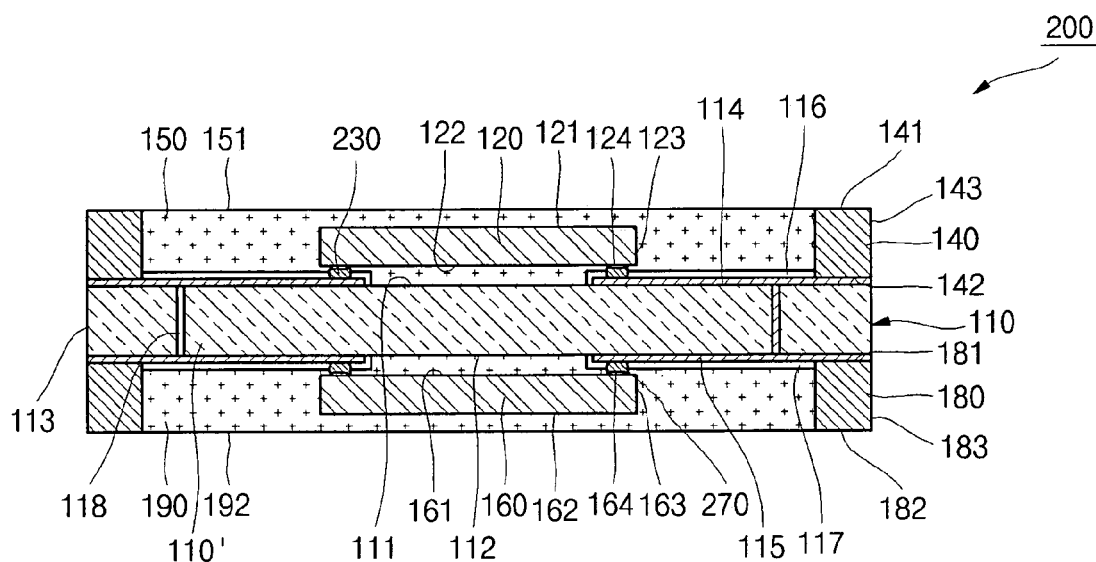
FIG. 3 is a sectional view showing a stack land grid array package according to another embodiment of the present invention.

Referring to FIG. 3, a stack land grid array package 200 according to another embodiment of the present invention is illustrated. The stack land grid array package 200 has a structure similar to that of the package 100 shown in FIG. 1B and the difference between them will now be described.

The stack land grid array package 200 of the present invention discloses that the bond pad 124 of the first semiconductor die 120 is electrically connected to the first electrically conductive pattern 114 of the substrate 110 with a first conductive bump 230. The bond pad 164 of the second semiconductor die 160 is also electrically connected to the second electrically conductive pattern 115 of the substrate 110 with a second conductive bump 270. The conductive bump 230 and 270 may be any one chosen from a gold, silver, solder, and equivalent thereof, but the material is not limited herein. Moreover, the first semiconductor die 120 and the first conductive bump 230 are covered with the first encapsulant 150, and the second semiconductor die 160 and the second conductive bump 270 are covered with the second encapsulant 190.

Of course, the first surface 121 of the first semiconductor die 120 may be exposed to the exterior of the first encapsulant 150, and the second surface 162 of the second semiconductor die 160 may be exposed to the exterior of the second encapsulant 190. Therefore, the heat radiation property of the package 200 is to be improved, and the thickness of the package 200 is to be thin.

Figure 4:
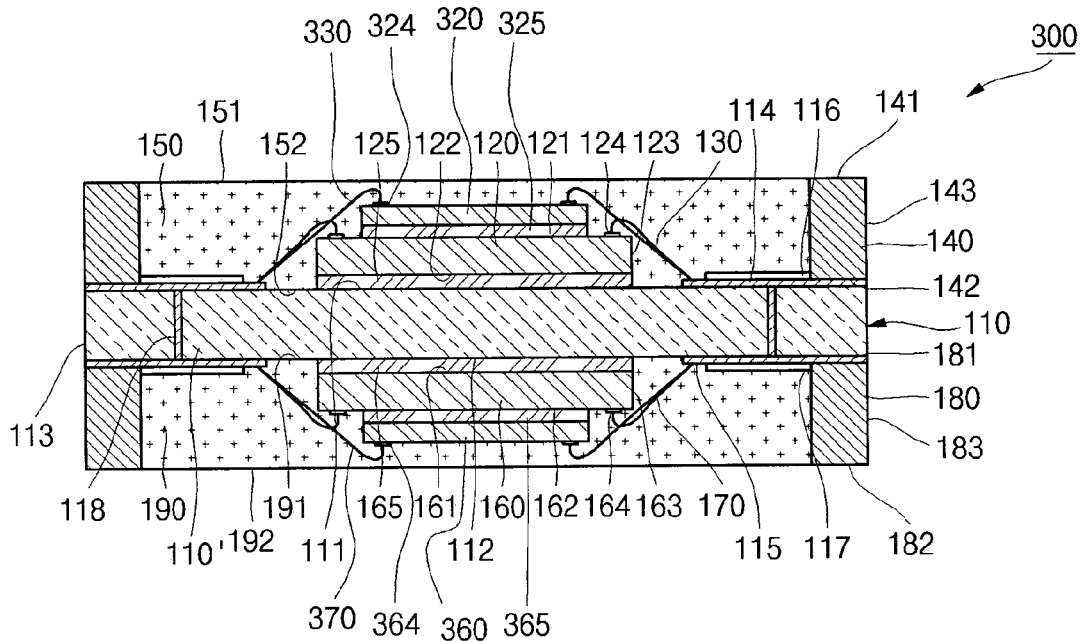
FIG. 4 is a sectional view showing a stack land grid array package according to another embodiment of the present invention.

Referring to FIG. 4, a stack land grid array package 300 according to another embodiment of the present invention is illustrated. The stack land grid array package 300 has a structure similar to that of the package 100 shown in FIG. 1B and the difference between them will now be described.

The stack land grid array package 300 of the present invention discloses that a third semiconductor die 320 is attached to the first surface 121 of the first semiconductor die 120 with an adhesive 325. That is, the third semiconductor die 320 is stacked on the first semiconductor die 120. A bond pad 324 of the third semiconductor die 320 is electrically connected to the first electrically conductive pattern 114 with a third conductive wire 330. The third semiconductor die 320 and the third conductive wire 330 are covered with the first encapsulant 150.

The stack land grid array package 300 of the present invention also discloses that a forth semiconductor die 360 is attached to the second surface 162 of the second semiconductor die 160 with an adhesive 365. That is, the forth semiconductor die 360 is stacked on the second semiconductor die 160. A bond pad 364 of the forth semiconductor die 360 is electrically connected to the second electrically conductive pattern 115 with a forth conductive wire 370. The forth semiconductor die 360 and the forth conductive wire 370 are covered with the second encapsulant 190. As such, since the present invention stacks a plurality of the semiconductor die, the package's capacity and function are improved.

Figure 5:
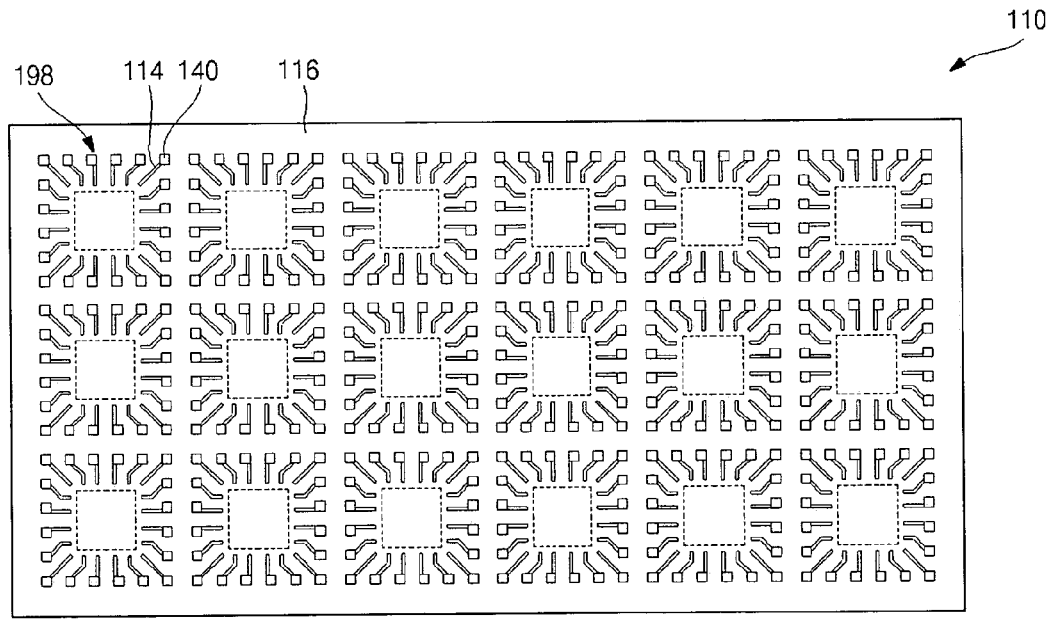
FIG. 5 is a top view showing a substrate strip used in a stack land grid array package according to the present invention.

Referring to FIG. 5, a substrate strip 110 used in a stack land grid array package according to the present invention is illustrated. As shown, the substrate strip 110 used in the present invention may have regions 198 arranged in a matrix having a number of rows and columns, in which packages are completed respectively. Although the regions 198 are shown to be arranged in three rows and six columns, the number is an example only. The regions are spaced a predetermined distance from one another and, after packages are completed therein, are sawn respectively.

Referring to FIGS. 6A to 6I, sectional views showing a method for manufacturing a stack land grid array package according to the present invention is illustrated.

Figure 6A:
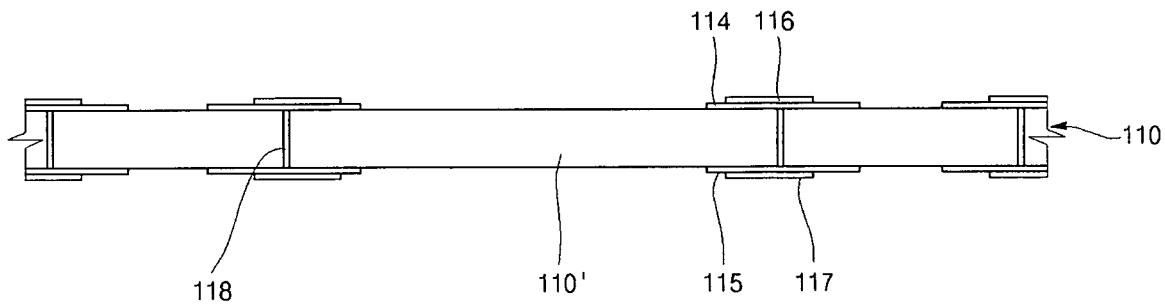
FIGS. 6A-6I are sectional views showing a method for manufacturing a stack land grid array package according to the present invention.
Figure 6B:
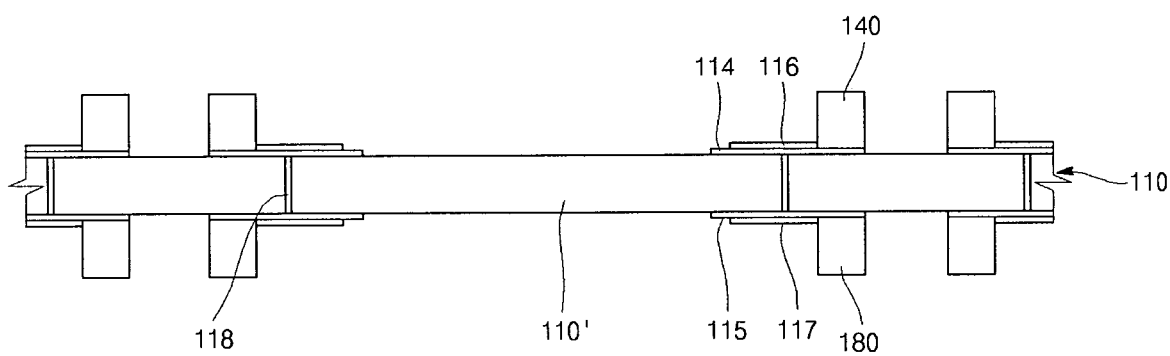
Figure 6C:
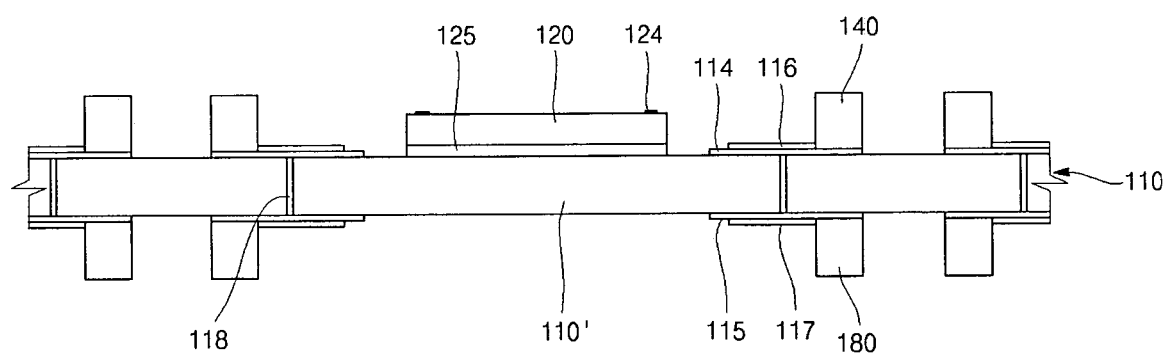
Figure 6D:
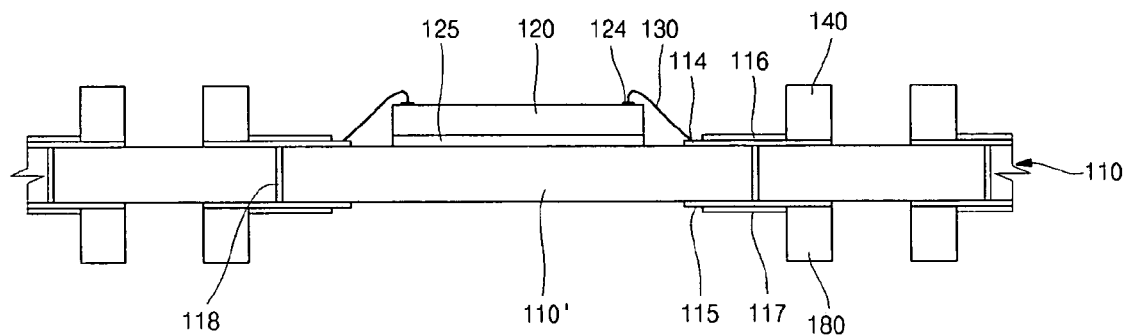
Figure 6E:
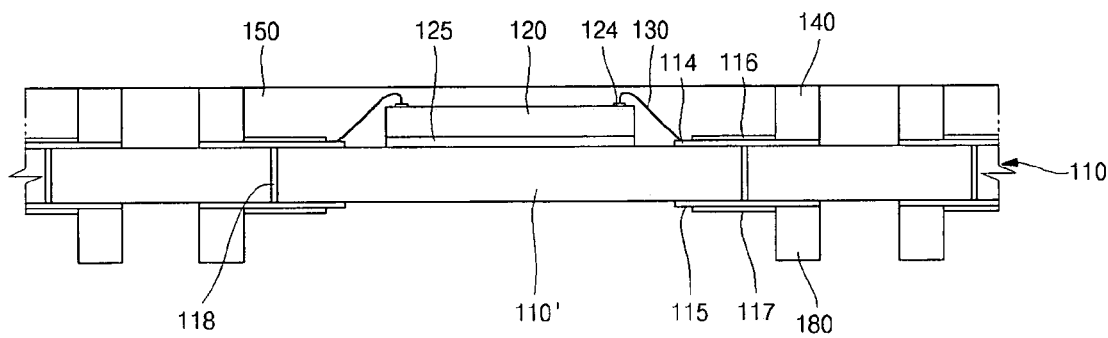
Figure 6F:
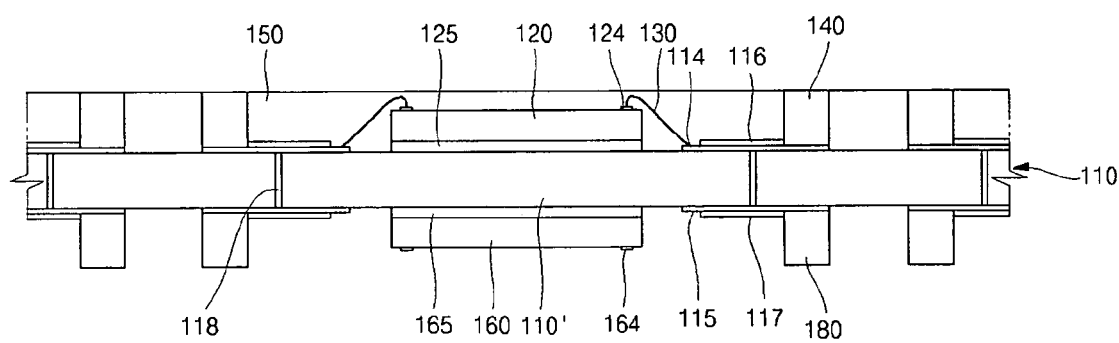
Figure 6G:
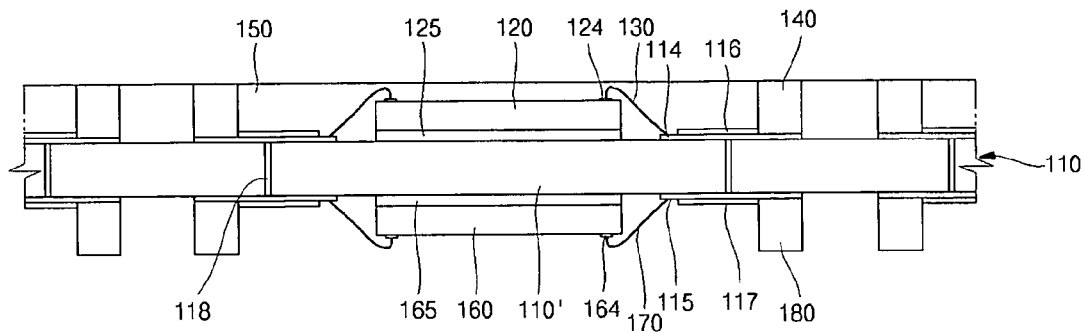
Figure 6H:
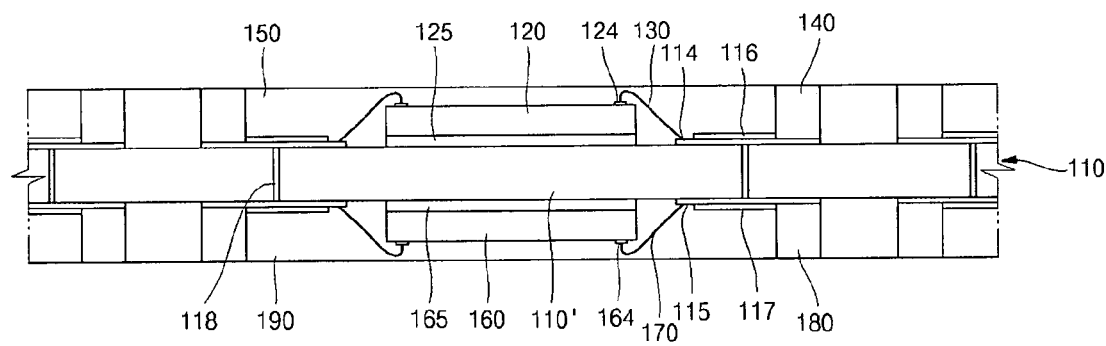
Figure 6I:
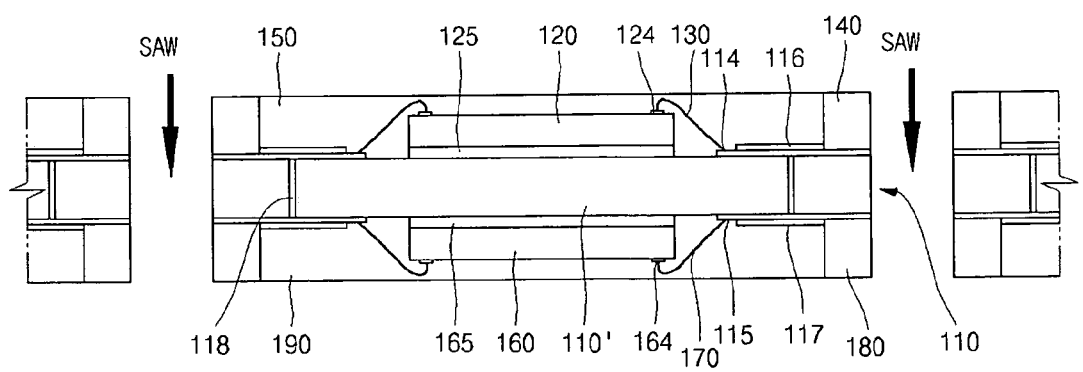

As shown, a method for manufacturing a stack land grid array package according to the present invention includes a substrate provision step (FIG. 6A), a first and second land formation step (FIG. 6B), a first semiconductor die bonding step (FIG. 6C), a first connection step (FIG. 6D), a first encapsulation step (FIG. 6E), a second semiconductor die bonding step (FIG. 6F), a second connection step (FIG. 6G), a second encapsulation step (FIG. 6H), and a sawing step (FIG. 6I).

In the substrate provision step, as shown in FIG. 6A, a substrate 110 having first and second electrically conductive patterns 114 and 115 formed on the upper and lower surfaces of an insulation layer 110' having a predetermined area, respectively, is provided. The first and second electrically conductive pattern 114 and 115 may be connected to each other by means of a conductive via 118 extending through the insulation layer 110'. The entire surface of the insulation layer 110' may be coated with protective layers 116 and 117, except for a region to which a connection member or land is to be connected later, to protect the first and second electrically conductive patterns 114 and 115 from external environments. The substrate 110 may be any one chosen from a conventional rigid PCB, a flexible PCB, and an equivalent thereof, but the material is not limited herein.

In the first and second land formation step, as shown in FIG. 6B, first and second lands 140 and 180 are formed in predetermined regions of the first and second electrically conductive patterns 114 and 115, respectively, with a predetermined thickness. The first and second lands 140 and 180 may be formed in a conventional plating method and must have a thickness larger than the loop height of a connection member to be formed later. For example, photoresist is applied to the substrate 110 and is subjected to exposure and development processes to remove the photoresist from regions in which first and second lands 140 and 180 are to be formed. The regions are subjected to electrolytic plating or sputtering with a desired thickness to form first and second lands 140 and 180. After the electrolytic plating or sputtering, the photoresist is removed.

In the first semiconductor die bonding step, as shown FIG. 6C, a first semiconductor die 120 is attached to the upper surface of the insulation layer 110' of the substrate 110 with an adhesive 125 which has been previously applied to the first semiconductor die 120 or the insulation layer 110'. The first semiconductor die 120 has at least one first bond pad 124 formed thereon.

In the first connection step, as shown in FIG. 6D, the substrate 110 and the first semiconductor die 120 are connected to each other using a first connection member 130. Particularly, the first electrically conductive pattern 114 of the substrate 110 and the first bond pad 124 of the first semiconductor die 120 are connected to each other using a first connection member 130. The first connection member 130 may be a conventional conductive wire such as a gold wire, an aluminum wire, and a copper wire, but the material is not limited in the present invention.

It is recommended that a heat block (not shown) positioned the substrate 110 should have a plurality of a hole, dent or groove to couple the land 180 formed at lower surface of the substrate 110 during the wire bonding. As such, the present invention can prevent bouncing phenomenon from wire bonding.

In the first encapsulation step, as shown in FIG. 6E, the first semiconductor die 120, the first connection member 130, and a portion of the first land 140 on the substrate 110 are encapsulated by a first encapsulant 150. The aforementioned are encapsulated in such a manner that the upper surface of the first encapsulant 150 is flush with the upper surface of the first land 140, in order to expose the upper surface of the first land 140 to the exterior of the first encapsulant 150. The first land 140 exposed via the first encapsulant 150 is connected to an external device or another package later. The first encapsulant 150 may be a conventional epoxy molding compound for encapsulating an object using a mold or a liquid epoxy resin for encapsulating an object using a disperser, but the material is not limited herein.

In the a second semiconductor die bonding step, as shown in FIG. 6F, a second semiconductor die 160 is bonded to the lower surface of the insulation layer 110' of the substrate 110 with an adhesive 165 which has been previously applied to the second semiconductor die 160 or the insulation layer 110'. The second semiconductor die 160 has at least one second bond pad 164 formed thereon.

In the second connection step, as shown in FIG. 6G, the substrate 110 and the second semiconductor die 160 are connected to each other using a second connection member 170. Particularly, the second electrically conductive pattern 115 of the substrate 110 and the second bond pad 164 of the second semiconductor die 160 are connected to each other using a second connection member 170. The second connection member 170 may be a conventional conductive wire such as a gold wire, an aluminum wire, and a copper wire, but the material is not limited in the present invention.

In the second encapsulation step, as shown in FIG. 6H, the second semiconductor die 160, the second connection member 170, and a portion of the second land 180 beneath the substrate 110 are encapsulated by a second encapsulant 190. The aforementioned are encapsulated in such a manner that the lower surface of the second encapsulant 190 is flush with the lower surface of the second land 180, in order to expose the lower surface of the second land 180 to the exterior of the second encapsulant 190. The second land 180 exposed via the second encapsulant 190 is connected to an external device or another package later. The second encapsulant 190 may be a conventional epoxy molding compound for encapsulating an object using a mold or a liquid epoxy resin for encapsulating an object using a disperser, but the material is not limited herein.

In the sawing step, as shown in FIG. 6I, each package is separated from the substrate strip using, for example, a diamond blade to complete a stack land grid array package according to the present invention. Particularly, the first encapsulant 150, the substrate 110, and the second encapsulant 190 are sawn using a diamond blade to complete each stack land grid array package. The sawing step is performed in such a manner that the lateral surfaces of the first land 140, the second land 180, the first encapsulant 150, and the second encapsulant 190 are flush with one another. Specifically, the lateral surface of the first land 140 is exposed via the lateral surface of the first encapsulant 150 and the lateral surface of the second land 180 is exposed via the second encapsulant 190.

Before or after the sawing step, laser marking or ink marking is performed on the surface of the first or second encapsulant 150 or 190 to inscribe desired characters, figures, or images.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
   a substrate having a first surface, a second surface, and electrically conductive patterns formed on the first surface and the second surface of the substrate;
   a first semiconductor die attached to the first surface of the substrate;
   a first connection member for electrically coupling the first semiconductor die to at least one electrically conductive pattern on the first surface of the substrate;

a first land extending from the first surface of the substrate, the first land having a first surface, a second surface approximately parallel to the first surface being electrically coupled to the at least one electrically conductive pattern on the first surface of the substrate;

a second semiconductor die attached to the second surface of the substrate;

a second connection member for electrically coupling the second semiconductor die to at least one electrically conductive pattern on the second surface of the substrate;

a second land extending from the second surface of the substrate and having a first surface and a second surface approximately parallel to the first surface, the first surface of the second land being electrically coupled to the at least one electrically conductive pattern on the second surface of the substrate; and an encapsulant for encapsulating the first semiconductor die, the first connection member, the second semiconductor die, the second connection member, and the first and second land such that the first surface of the first land and the second surface of the second land is exposed, wherein the encapsulant comprises:

a first encapsulant having an approximately planar first surface, a second surface approximately parallel to the first surface and coupled to the first surface of the substrate, and a third surface positioned along the periphery of the first and second surfaces while being approximately perpendicular to the first and second surfaces, the first surface of the first encapsulant approximately planar with the first surface of the first land, the first surface of the first land being exposed; and a second encapsulant having a first surface coupled to the second surface of the substrate, a second surface approximately parallel to the first surface, and a third surface positioned along the periphery of the first and second surfaces while being approximately perpendicular to the first and second surfaces.

2. A semiconductor device in accordance with claim 1, wherein the first land has a third surface approximately perpendicular to the first and second surfaces of the first land, the third surface being exposed.

3. A semiconductor device in accordance with claim 2, wherein the third surface of the first land is approximately planar with a third surface of the substrate, the third surface of the substrate positioned along a periphery and approximately perpendicular to the first and second surfaces of the substrate.

4. A semiconductor device in accordance with claim 2, wherein the third surface of the first encapsulant is approximately planar planer with the third surface of the first land so that the third surface of the first land is exposed.

5. A semiconductor device in accordance with in claim 3, wherein the third surface of the first encapsulant, the third surface of the first land, and the third surface of the substrate are approximately planar with one another.

6. A semiconductor device in accordance with claim 1, wherein the second surface of the second encapsulant is approximately flush with the second surface of the second land so that the second surface of the second land is exposed.

7. A semiconductor device in accordance with claim 1, further comprising a third surface on the second land, the third surface positioned along an outer periphery and approximately perpendicular to the first and second surfaces of the second land, wherein the third surface of the second land is exposed.

8. A semiconductor device in accordance with claim 7, wherein the third surface of the second land is approximately planar with a third surface of the substrate, the third surface of the substrate positioned along a periphery and approximately perpendicular to the first and second surfaces of the substrate.

9. A semiconductor device in accordance with claim 7, wherein the third surface of the second encapsulant is approximately planar with the third surface of the second land so that the third surface of the second land is exposed.

10. A semiconductor device in accordance with claim 8, wherein the third surface of the second encapsulant, the third surface of the second land, and the third surface of the substrate are approximately planar with one another.

11. A semiconductor device in accordance with claim 1, wherein the substrate has a conductive via formed thereon to electrically couple the at least one electrically conductive pattern on the first surface of the substrate with the at least one electrically conductive pattern on the second surface of the substrate.

12. A semiconductor device in accordance with claim 1, wherein a first semiconductor device having a first and second land is stacked on top of a second semiconductor device having a first and second land such that first land of the second semiconductor device is coupled to the second land of the first semiconductor device.

13. A semiconductor device comprising:

a substrate having a first and second surface;

a first semiconductor die attached to the first surface of the substrate;

a first land extending from the first surface of the substrate and having a substantially planar surface;

a second semiconductor die attached to the second surface of the substrate;

a second land extending from the second surface of the substrate and having a substantially planar surface; and a first encapsulant for encapsulating the first semiconductor die and a portion of the first land, wherein the surface of the first land is exposed, and wherein a surface of the first encapsulant is substantially planar with the exposed surface of the first land.

14. A semiconductor device in accordance with claim 13 further comprising a second encapsulant for encapsulating the second semiconductor die and a portion of the second land, wherein the surface of the second land is exposed and wherein a surface of the second encapsulant is substantially planar with the exposed surface of the second land.

15. A semiconductor device in accordance with claim 14 wherein a height of the exposed surface of the first land is above a height of the first semiconductor die and a height of the exposed surface of the second land is above a height of the second semiconductor die.

16. A semiconductor device comprising:

a substrate having a first and second surface;

a first semiconductor die attached to the first surface of the substrate;

a first means for interconnection extending from the first surface of the substrate and having a substantially planar surface;

a second semiconductor die attached to the second surface of the substrate;

a second means for interconnection extending from the second surface of the substrate and having a substantially planar surface; and a first encapsulant for encapsulating the first semiconductor die and a portion of the first means, wherein the surface of the first means is exposed, and wherein a surface of the first encapsulant is substantially planar with the exposed surface of the first means.

17. A semiconductor device in accordance with claim 16 further comprising a second encapsulant for encapsulating the second semiconductor die and a portion of the second means, wherein the surface of the second means is exposed and wherein a surface of the second encapsulant is substantially planar with the exposed surface of the second means.

18. A semiconductor device in accordance with claim 17 wherein a height of the exposed surface of the first means is above a height of the first semiconductor die and a height of the exposed surface of the second means is above a height of the second semiconductor die.

19. A semiconductor device in accordance with claim 13 wherein side surfaces of the substrate, first land, and first encapsulant are substantially coplanar.

20. A semiconductor device in accordance with claim 16 side surfaces of the substrate, first means, and first encapsulant are substantially coplanar.

\* \* \* \* \*

UNITED STATES PATENT AND TRADEMARK OFFICE
CERTIFICATE OF CORRECTION

PATENT NO. : 7,408,254 B1  Page 1 of 1
APPLICATION NO. : 11/212979
DATED : August 5, 2008
INVENTOR(S) : Bong Chan Kim, Yoon Joo Kim and Youn Sang Kim It is certified that error appears in the above-identified patent and that said Letters Patent is hereby corrected as shown below:

Title page, item (73) Assignee: should read as follows:

Amkor Technology, Inc., Chandler, AZ

Signed and Sealed this

Seventeenth Day of November, 2009

David J. Kappos
*Director of the United States Patent and Trademark Office*